(12) United States Patent
Ho et al.

(10) Patent No.: US 6,835,803 B1
(45) Date of Patent: Dec. 28, 2004

(54) METHOD FOR DOPING A POLYMER

(75) Inventors: Peter Kian-Hoon Ho, Cambridge (GB); Ji-Seon Kim, Cambridge (GB); Richard Henry Friend, Cambridge (GB)

(73) Assignee: Cambridge Display Technology Ltd., Cambridge (GB)

( * ) Notice: Subject to any disclaimer, the term of this patent is extended or adjusted under 35 U.S.C. 154(b) by 0 days.

(21) Appl. No.: 09/958,257

(22) PCT Filed: Apr. 5, 2000

(86) PCT No.: PCT/GB00/01288
§ 371 (c)(1),
(2), (4) Date: Feb. 19, 2002

(87) PCT Pub. No.: WO00/60612

PCT Pub. Date: Oct. 12, 2000

(30) Foreign Application Priority Data

Apr. 6, 2000 (GB) ............................................. 9907802

(51) Int. Cl.[7] .............................................. C08G 61/00
(52) U.S. Cl. .......................... 528/486; 528/86; 528/480
(58) Field of Search ................................ 528/486, 480, 528/86

(56) References Cited

U.S. PATENT DOCUMENTS 4,222,903 A    9/1980   Heeger et al. ............... 252/518

FOREIGN PATENT DOCUMENTS

GB    WO 00/04593    *  1/2000
WO    WO 00/04593       1/2000

OTHER PUBLICATIONS

"Protonic Acids: Generally Applicable Dopants for Conducting Polymers", Han et al., Synthetic Metals, 30 (1989) pp. 123–131.

International Search Report in PCT/GB00/01288 dated Aug. 3, 2000.

International Preliminary Examination Report in PCT/GB00/01288 dated Aug. 8, 2001.

* cited by examiner

*Primary Examiner*—Duc Truong
(74) *Attorney, Agent, or Firm*—Marshall, Gerstein & Borun LLP

(57) ABSTRACT

A method for forming a conjugated polymer which is doped by a dopant includes the steps of (a) adding a doping agent comprising a dopant moiety to a solution containing the conjugated polymer or a precursor thereof and, optionally, a second polymer, the dopant moiety being capable of bonding to the conjugated polymer, precursor thereof or the second polymer; (b) allowing the dopant moiety to bond to the conjugated polymer, precursor thereof or the second polymer to perform doping of the conjugated polymer, wherein the amount of doping agent added in step (a) is less than the amount required to form a fully doped conjugated polymer.

37 Claims, 6 Drawing Sheets

METHOD FOR DOPING A POLYMER

Figure 1:
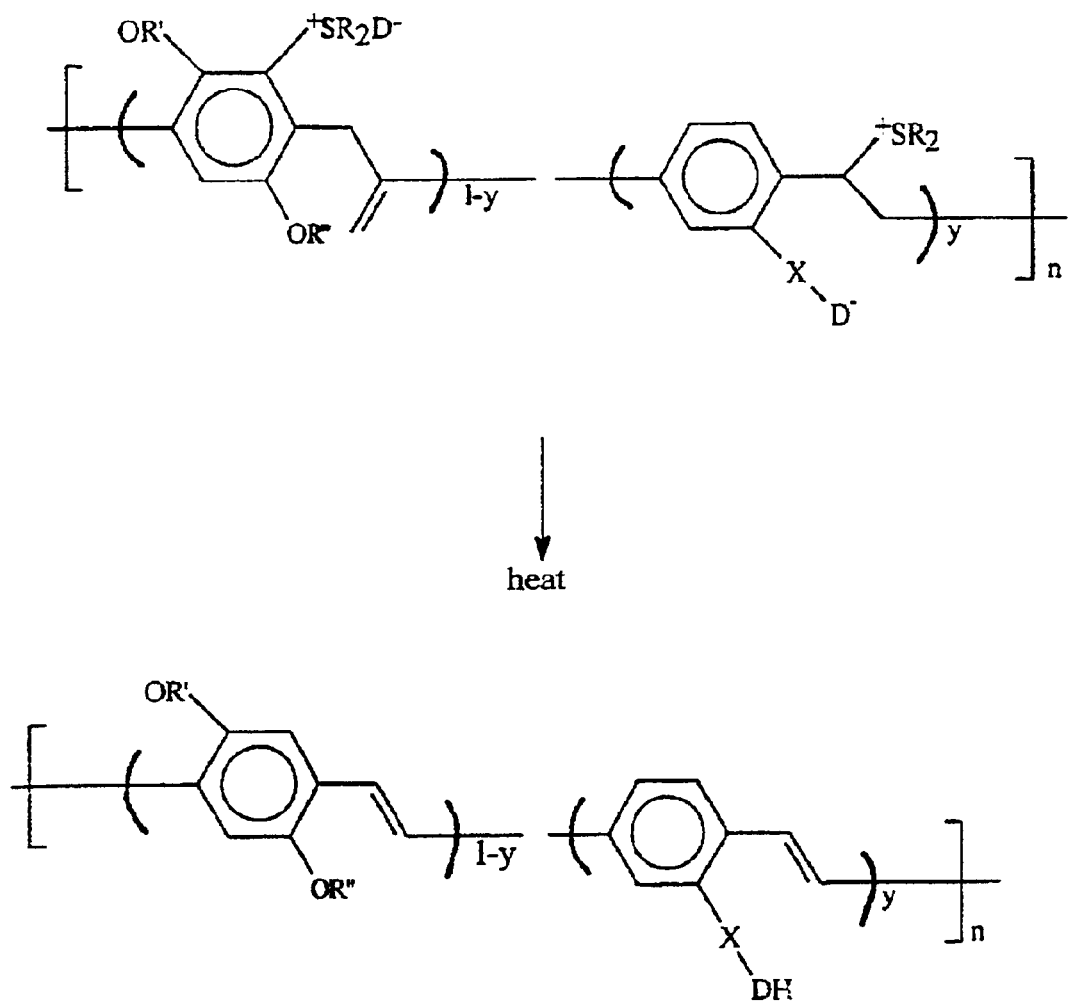

This is the U.S. national phase of International Application No. PCT/GB00/01288 filed Apr. 5, 2000, the entire disclosure of which is incorporated herein by reference.

The present invention relates to a method for doping a conjugated polymer. Polymers preparable according to the method of the present invention are provided.

Doping of conjugated polymers (polymers with pi-conjugated backbone structures and/or pi-conjugated pendant groups) with strong protonic acid (p-doping) or strong oxidising (p-doping) or reducing agents (n-doping) is well established in the literature. However, the doping proceeds readily to completion in the presence of a stoichiometric or excess amount of dopants. The chemical driving force for maximum doping is very high, so that it is difficult to arrest the doping level at an intermediate; is value. The system achieves the maximum doping with about 10–50% of the conjugated repeat units doped depending on the polymer system. For poly(p-phenylenevinylenes) and polyacetylenes, this is typically 10–20%; for polythiophenes, 20–30%; for polyanilines, 40–50%. This maximum level of doping imparts a high level of electrical conductivity of the order of 1–1000 S/cm to the polymers, depending on the nature and type of the polymers and dopants used, so that they become conducting polymers in the process. The bulk carrier concentration is then roughly of the order of $10^{20}$ /cm$^3$ to $10^{21}$ /cm$^3$.

However, this high level of doping is unnecessary or even undesirable for some applications. For example, for a 1-$\mu$m thick film (which is typical of the vertical thickness of photonic structures) having a conductivity of $10^{-6}$ S/cm, only a modest 1-V potential difference is required to drive a practical device current density of 10 mA/cm$^2$ through the film thickness direction. Therefore, film conductivities of the order of 10–6 $10^{-2}$ S/cm (typical of the semiconducting range) are already sufficient for these films to be employed in semiconducting photonic structures such as distributed Bragg reflectors and waveguides.

Furthermore, when the films are doped to the maximum, such as achieved by straightforward exposure to strong acids or oxidants, their optical properties change in drastic ways owing to the formation of new sub-gap transitions-that change the refractive indices of the films and cause parasitic absorption of any emitted light. Both these factors are not desirable or acceptable for photonic applications. Therefore control of the bulk carrier concentration between $10^{17}$ /cm$^3$ to $10^{20}$ /c$^3$, at an intermediate doping-level at least about one order of magnitude less than the maximally-doped case, is crucial.

Applied Physics Letters, volume 73, Number 2, pages 253–255 (1998) reports a study of the Hall mobility and the carrier concentration of a conjugated polymer, namely polythiophene, as a function of the electrochemical doping level. The doping level of the polymer is changed by varying the oxidation potential i.e. by potentiometric control.

Synthetic Metals, 68, pages 65–70 (1994) is concerned with field-effect mobility and conductivity data obtained from two different amorphous organic semiconductors which can be doped to a range of different conductivities.

Synthetic Metals, 89, page 11–15 (1997) investigates the doping and temperature dependence of the conductivity of poly(p)-phenylene vinylene) (PPV).

Synthetic Metals, 55–57, page 3597–3602 (1993) investigates electrical conductivity of $\alpha,\alpha$-coupled dodecathiophene as a function of both dopant level and time.

Synthetic Metals, 30, page 123–131 (1989) discloses a relationship between acid strength and ionization potential of a conjugated polymer that will give a highly conductive doped complex.

Applied Physics Letters, volume 72, page 2147–2149 (1998) describes a doped hole transporting polymer. Differing levels of doping are realized by adjusting the co-evaporation rates of polymer and dopant material.

The methods used to achieve different levels of doping in the above systems are not satisfactory for controlling the doping level to such a degree so that a balance between optical and electrical property of the doped polymer can be struck.

In view of the above, there remains a need to develop a method for preparing polymers which are doped to a controlled, low or intermediate level which is both simple and cost effective It is envisaged that polymers doped to such a level will be particularly useful in devices such as those referred to,below in order to avoid the disadvantages associated with polymers that are doped to a high level. These disadvantages include intense sub-group absorptions, changes in the optical properties of the polymer and degradation of the photonic structure of the polymer. Using polymers that are doped to a controlled, low level or intermediate it will be possible to strike a balance between optical and electrical properties of an organic semiconductor when used in an optoelectronic device.

The present invention aims to provide a method for forming a conjugated polymer that is partially doped. The present invention further aims to provide a polymer preparable according to the method of the present invention and uses of such polymers.

Accordingly, the present invention provides a method for forming a conjugated polymer which is doped by a dopant comprising the steps of:
 (a) adding a doping agent comprising a dopant moiety to a solution comprising the conjugated polymer or a precursor thereof and, optionally, a second polymer, the dopant moiety being capable of bonding to the conjugated polymer, precursor thereof or the second polymer;
 (b) allowing the dopant moiety to bond to the conjugated polymer, precursor thereof or the second polymer to perform doping of the conjugated polymer, characterised in that the amount of doping agent added in step (a) is less than the amount required to form a fully doped conjugated polymer.

The present invention further provides a conjugated polymer that is doped to a controlled, low or intermediate level which is preparable according to the method of the present invention.

The present invention still further provides a photonic device including a polymer according to the present invention.

One embodiment of the present invention provides a method for forming a partially doped polymer material, comprising: adding a doping agent to the polymer or a precursor thereof, the doping agent being capable of bonding to the precursor or the polymer chain; and causing the doping agent to leave the precursor or the polymer chain to form a dopant capable of doping the polymer chain; wherein fewer moles of the doping agent are added than would be numerically sufficient to fully dope the polymer chain. Also, the present invention provides a partially doped polymer material formed by that method. Further, the present invention provides a device/structure (such as a photonic device) that includes such a material.

The conjugated polymer or its precursor is:
 (i) derivatised with a controlled concentration (typically at the level less than 10–20% of the amount required for full doping) of a dopant moiety(ies) or its(their) precursor form(s); or (ii) blended together with a polymer partner (the second polymer),, which may or may not be a conjugated polymer itself, which is derivatised with such moieties to give the equivalent dopant concentration.

Photonic structures are then fabricated from the partially doped polymer materials, including higher-order blends and composites, containing these modified conjugated polymers by film-forming techniques. A subsequent thermal, irradiation or chemical activation step may be required to generate the active dopant to dope the conjugated polymer.

In a first aspect of the invention, a method is provided to manipulate a precursor polyelectrolyte to give a controllable partially-doped conjugated polymer after elimination. The method involves replacement of a fraction of the counter-anions of the precursor polyelectrolyte by acid anions, such as sulfonates, phosphonates, phosphates, etc, of benzene, naphthalene and other organic derivatives while the precursor polyelectrolyte is in solution. These anions are converted during thermal elimination to the corresponding strong organic acids which are less volatile and more compatible with the conjugated polymer than the conventional anions, such as chloride, bromide and acetate. This leads to a higher retention of a strong acid that could favourably dope the polymer.

In a second aspect of the present invention, a method is provided for control over partial doping of a host conjugated polymer by blending with measured amounts of another substantially-miscible polymer (the "second polymer") which is derivatised with a small fraction of dopant groups such as sulfonic acid, phosphonic acid or their precursors. The second polymer provides a means to distribute substantially homogeneously a controlled amount of dopant groups into the host conjugated polymer matrix. For this to occur, the second polymer must be co-soluble in the same solvent used to deposit the desired conjugated polymer film, and preferably not undergo phase segregation in the matrix. This can be achieved by derivatising to form a doped second polymer with a small fraction (usually less than 50 mol %) of the dopant groups. If the derivatisation reaction is carried too far, the material produced tends to be no longer soluble in the common hydrocarbon solvents used to solubilise the conjugated polymers because of strong interaction of the polar dopant groups.

In a third aspect of the present invention, a method is provided for control over partial doping of a host conjugated polymer in solution by derivatisation with measured amounts of the dopant moieties, such as sulfonic acid, phosphonic acid or their precursors thereby, in effect, creating a copolymer. The order of the reaction may be inverted. Either the polymer can be formed first and then derivatised with a small mole fraction of the dopant; or the monomer could be derivatised first with the dopant group or its precursor and then incorporated at a small mole fraction into the primary conjugated polymer. The aim is to distribute substantially homogenously a controlled amount of dopant groups into the conjugated polymer matrix.

The present invention will now be described in more detail with,, reference to the attached drawings in which:

FIG. 1 shows the reaction scheme according to Example 1. The scheme is applicable to conjugated polymers that are fabricated by thermal elimination of a cationic precursor polyelectrolyte. An example of, such a polymer is PPV. In FIG. 1, X is an optional alkyl or aryl spacer group, OR' and OR" are optional alkoxy groups, D$^-$ is a precursor dopant moiety, for example, PO$_3$H$^-$, SO$_3^-$ or OPO$_3$H$^-$, y≦0.05 and n≧10.

Figure 2A:
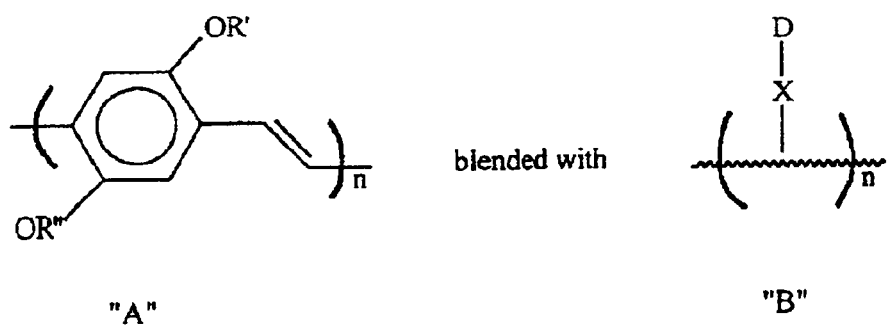

FIG. 2a shows a polymer blend preparable according to the reaction scheme of Example 2. Example 2 is generally applicable to soluble conjugated polymers. Examples of such polymers include alkyl- and alkoxy- derivatives of PPV, poly(fluorenes) and their copolymers. "A" is a conjugated polymer host that is blended with "B", the second polymer, that is conjugated or non-conjugated. D is a non-precursor dopant moiety such as. PO$_3$H$_2$, SO$_3$H or CF$_2$COOH and n is as defined for FIG. 1.

Figure 2B:
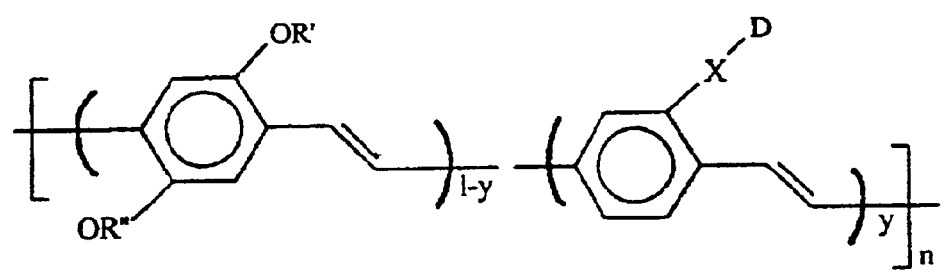

FIG. 2b shows two copolymers preparable according to the reaction scheme in Example 3. Example 3 is generally applicable to soluble conjugated polymers. Examples of such polymers include alkyl and alkoxy- derivatives of PPV, poly (fluorenes) and their copolymers. OR', OR", X, D, n and y are as defined for FIGS. 1 and 2a.

Figure 3A:
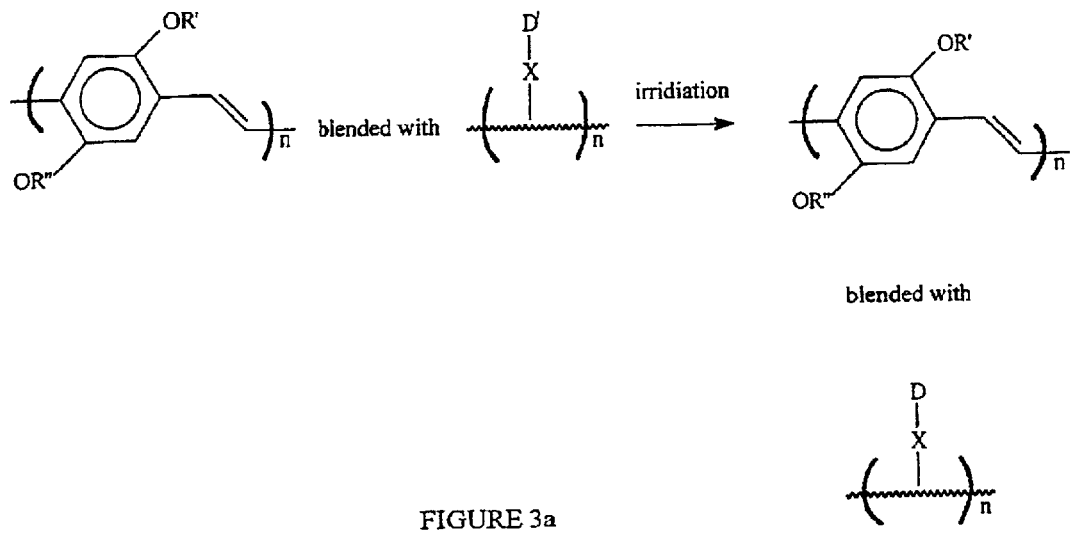
Figure 3B:
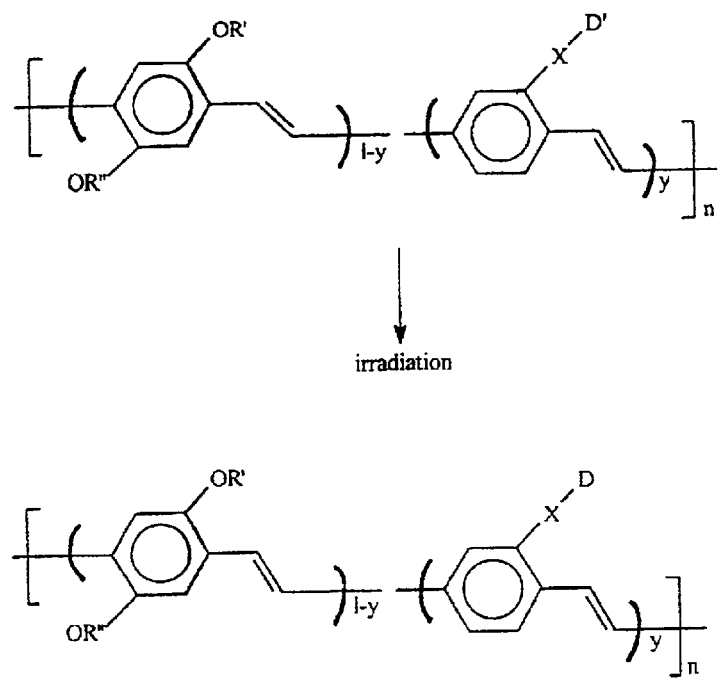

FIG. 3 shows two reaction schemes for activating a precursor dopant moiety, D, that is (a) bonded to a second polymer in a blend or (b) part of a co-polymer system. D suitably may be SO$_3$H and D' suitably may be

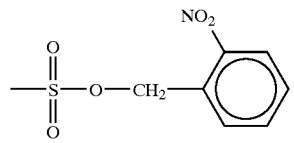

OR', OR", y, n and X are as defined for FIG. 1.

Figure 4:
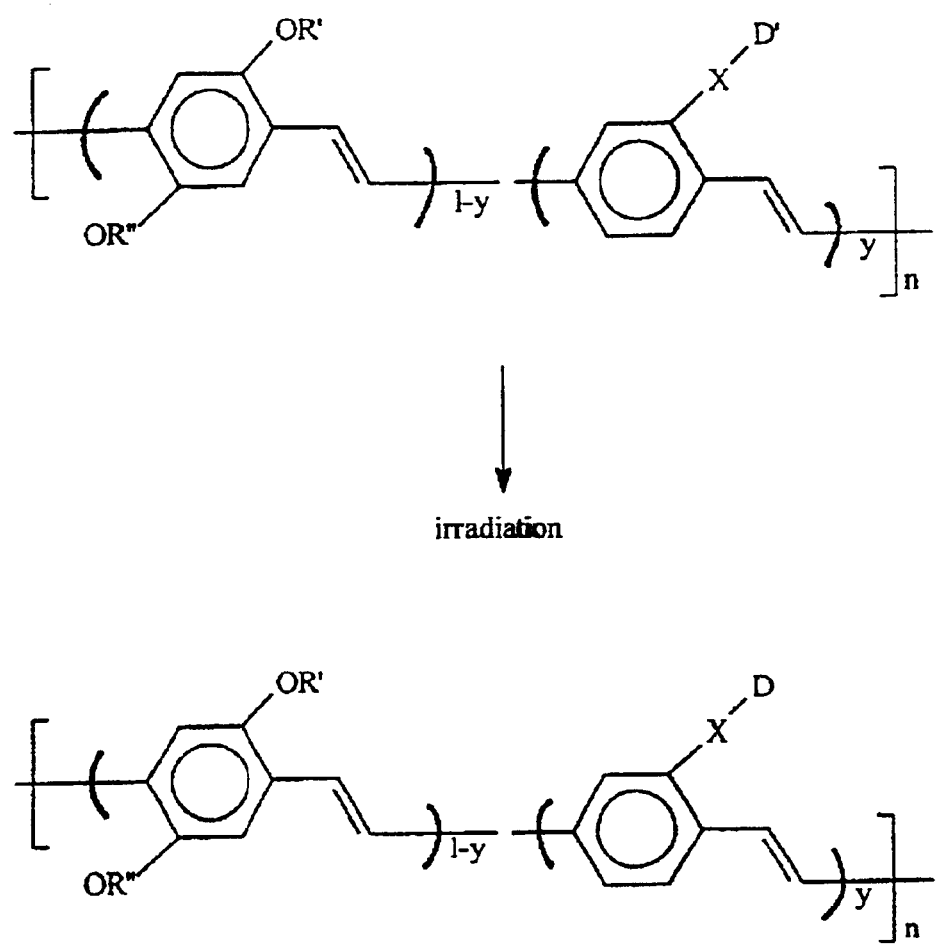

FIG. 4 shows a reaction scheme for activating a precursor dopant moiety D' that is part of a co-polymer system. Suitably D' may be

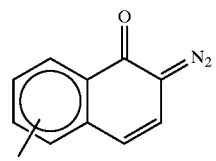

and D may be

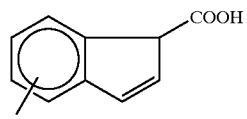

OR', OR", y, n and X are as defined for FIG. 1.

Figure 5:
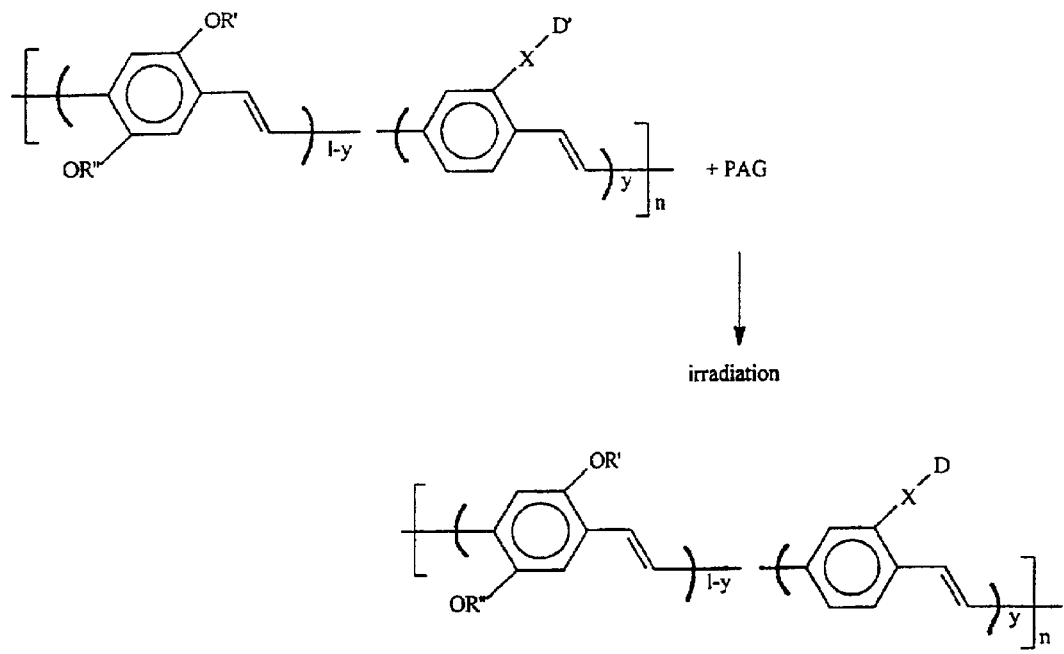

FIG. 5 shows a reaction scheme for activating a precursor dopant moiety D' that is part of a co-polymer system. Suitably D' may be SO$_3$R or PO$_3$R$_2$ and D may be SO$_3$H or PO$_3$H$_2$. R is a leaving group. OR', OR", y, n and X are as defined for FIG. 1. PAG, a photoacid generator, suitably is a diaryliodonium salt, triarylsulfonium salt or other onium salt.

Figure 6:
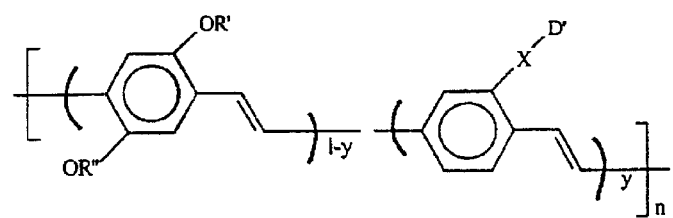

FIG. 6 shows an example of a polymer according to the present invention including a dopant moiety that is a redox group. Suitably D' may be ferrocenium or viologen. OR', OR", X, hand y are as defined in FIG. 1.

Figure 7:
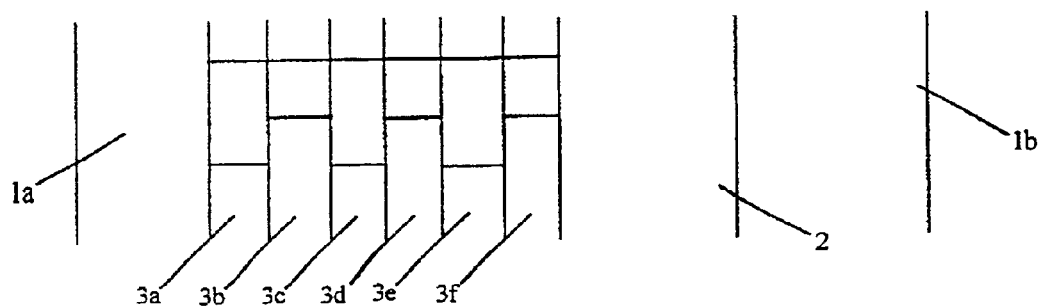

FIG. 7 shows schematically, the energy level structure of a DBR formed by means of partially doped conjugated polymer materials. 1a and 1b are electrodes. 2 is an emissive layer. 3a–3f are polymer layers which form a "mirror structure". The HOMO and LUMO levels of the polymer layers 3a–3f are shown.

The conjugated polymer according to the present invention may be a homopolymer, copolymer, blend or composite material of conjugated polymers. For the purposes of the present invention, a conjugated polymer is defined as a polymer with a partially or fully n-conjugated backbone and/or n-conjugated pendent groups. The conjugated polymer after doping is preferably partially conducting. The conjugated polymer after doping is preferably partially semi-conducting.

The present invention realizes the incorporation of an amount of dopant, or its precursor, into a polymer film, via chemical derivatisation on the conjugated polymer chain itself or chemical derivatisation on another polymer partner (the second polymer) with which the first polymer is to blended or copolymerised. The second polymer may or may not be conjugated.

The dopant level of a polymer produced according to the present method is stable and readily controllable.

Preferably, the amount of doping agent added in step (a) is in the range of less than 10–20%, preferably 1 to 10%, of the amount required to form a fully doped conjugated polymer. Accordingly, the polymer produced in accordance with the present method, preferably, is doped to a level of less than 10–20% compared to full or maximum doping. More preferably, the amount of doping agent added in step (a) is sufficient to form a 0.001% to 5% doped conjugated polymer. Even more preferably, the amount of doping agent added in step (a) is sufficient to form a 0.1 to 1% doped conjugated polymer. The polymer produced in accordance with the present method, preferably, will have one doped site per $10^2$–$10^4$ repeat units.

The conductivity of the polymer after doping is suitably more than $10^{-9}$ S/cm and less than 1 S/cm, preferably $10^{-8}$ S/cm to $10^{-3}$ S/cm, or preferably $10^{-6}$ to $10^{-2}$ S/cm. The conductivity of the polymer after doping is suitably less than 1 S/cm. Preferably, the conductivity of the polymer after doping is less than $10^{-2}$ S/CM or $10^{-3}$ S/cm. It is envisaged that the conductivity of the polymer after doping also may be less than $10^{-4}$ S/cm or $10^{-5}$ S/cm. It is envisaged that the conductivity may be in the range from $10^{-9}$ S/cm to $10^{-13}$ S/cm, and preferably, in the range from $10^{-9}$ S/cm to $10^{-3}$ S/cm or $10^{-6}$ S/cm to $10^{-2}$ S/cm. The amount of dopant that is added is preferably an effective amount to achieve a conductivity in such a range.

In an alternative definition of a polymer preparable in accordance with the present method, the polymer is doped to a level of $10^{17}$–$10^{19}$ cm$^{-3}$.

The doping agent may bond to the precursor or polymer chain by replacing a leaving group on the chain.

In one embodiment of the present invention, the doping agent is a protonic acid doping agent. Suitable dopant moieties include a phosphonic acid group, a sulphonic acid group, a fluoroalkyl carboxylic acid group or an indene carboxylic acid group.

Where the dopant moiety comprises a precursor to the dopant, the precursor preferably comprises phosphonate or sulfonate.

If the dopant is incorporated in the precursor form, subsequent activation to generate the active dopant to dope the polymer may be necessary. This activation could be by thermal, irradiation, chemical or other means. Obviously, this would be unnecessary if the dopant is already incorporated in the active form.

In a further aspect of the present invention, the method also includes a step of causing the dopant to dissociate, for example by the application of light and/or heat. This involves cleaving the dopant moiety from the conjugated polymer, precursor thereof or the second polymer after the dopant moiety has been allowed to bond to it in step (b). This additional step enables the dopant to be dispersed uniformly or substantially uniformly into the polymer matrix comprising the conjugated polymer or precursor thereof and, optionally, the second polymer. This renders the dopant substantially non-diffusing and non-volatile.

Where the dopant moiety bonds to a precursor of the conjugated polymer, the method further comprises a step of forming a conjugated polymer from the precursor thereof.

The step of causing the doping agent to leave the polymer chain may be effected by heating. The step of causing the doping agent to leave the polymer chain may result also in conjugation of the polymer and/or formation of the polymer from the precursor.

Optionally, the dopant moiety may bond to the conjugated polymer, precursor thereof or the second polymer in step (b) via spacer group X. Suitable spacer groups include, but are not limited to, alkyl and aryl groups.

The conjugated polymer according to the present invention may be any conjugated polymer and, suitably, may comprise precursor polyelectrolyte PPV or substituted PPVs. The dopant moiety counterion Y may comprise a phosphonate, sulfonate, phosphate, antimonate, borate, molybdate. These counterions may form a side-chain attached to the polymer backbone when, they bond to the precursor conjugated polymer.

Non-precursor acid dopants include (a) phosphonic, acid, (b) sulfonic acid, (c) fluorocarboxyl acid groups.

Precursor acid dopants include (a) o-nitrobenzyl sulfonate side-chains (converting to sulfonic acid group upon irradiation), see FIG. 3; (b) diazonapthaquinone sulfonate side-chains (converting to indene carboxylic acid upon irradiation), see. FIG. 4; (c) phosphonate or sulfonate ester side-chains, together with an incorporated photoacid generator (PAG) such as one of the onium salts (the onium salts generating a strong protonic acid upon irradiation which cleaves the sulfonate or phosphonate ester leaving group to the corresponding acid),: see FIG. 5. See for example, A. Reiser "Photoreactive polymers: the science and technology of resists," John Wiley & Sons, New York, 1989.

The conjugated polymer according to the present invention may comprise poly,(alkylthiophenes) and poly (alkylfluorenes) or their partners. They should be derivatised with a dopant moiety Y comprising a protonic acid group. Suitable photonic acid groups include phosphonic acid, sulfonic acid, carboxylic acid or their precursor in the form of esters, anhydrides, azides, hydrazides, amides, acid chlorides. The precursor form is capable of converting to the active protonic acid form under irradiation, thermal exposure, or by reaction with another chemical agent that may be originally deposited with the film or subsequently introduced to the film. In addition, the acid group or its precursor form could be spaced from the polymer mainchain by an alkyl or aryl spacer and could also be attached as a separate functional unit on the polymer chain.

A further class of suitable dopant moieties for use in the present method include redox groups based on TCNQ, DDQ, TTF, ferrocene, viologen, iron(III) chelates, or their precursors. The precursor form is capable of converting to the active form under irradiation, thermal exposure, or by reaction with another chemical agent. These groups could also be spaced from the polymer main chain by an alkyl or aryl spacer or attached to separate functional units on the chain. The redox group could accept electrons or donate electrons to the conjugated units, thereby p-doping and n-doping the conjugated units, respectively.

Partially doped materials formed, for example, as described above could be used to form photonic structures such as distributed Bragg reflectors (potentially pumped reflectors), confinement heterostructures etc. Some examples of device structures which particularly advantageously may include a partially doped conjugated polymer preparable according to the present method are described in our co-pending UK patent application, number 9815271.3, the contents of which are incorporated herein by reference.

The photonic device may include a plurality of layers of such doped materials, the layers alternative in their levels of doping. The device could be a mirror, for instance a distributed, Bragg reflector.

A distributed Bragg :reflector (DBR) consists of a stack of regularly alternating higher- and lower-refractive index dielectrics (light transmissive materials) fabricated to fulfil the Bragg condition for reflection at particular wavelengths. This occurs when the optical path of the periodicity in the dielectric stack corresponds to half a wavelength, and the reflectivity is further optimised when the DBR stack obeys the equation: $½λ=n_1d_1+ n_2d_2$ and for the best performance, the DBR stack obeys the equation: $½λ=n_1d_1=n_2d_2$, where $n_1$, $n_2$ are the respective refractive indices; $d_1$, $d_2$ are the corresponding component film thicknesses in the DBR; and $λ$ is the desired reflection wavelength.

FIG. 7 shows schematically the energy level structure of a DBR formed by means of partially doped conjugated polymer materials. The doping of the materials is controlled so that the HOMO or LUMO levels (depending on whether the mirror is between the anode or the cathode and the emissive layer) of alternate layers of the mirror are at least approximately aligned so that the passage of holes/electrons through the mirror is not significantly impeded at the boundaries between layers of the mirror. The thicknesses of the layers of the mirror are chosen to satisfy the conditions for reflection. The refractive index of the layers is related to their band gaps, but by means of partial doping the HOMO/LUMO levels can be aligned independently of the band gaps.

Since the DBR is formed of conjugated material it could be electrically-pumped to generate photons in addition to reflecting.

The present invention will now be described by way of non-limiting illustrative examples.

EXAMPLES

Example 1

Partial Doping of Poly(p-phenylenevinylene) by Anion Exchange of the Precursor Poly(p-xylylene-alpha-tetrahydrothiophene) Route This is an exemplification of the scheme outlined in FIG. 1. This Example illustrates the first aspect of the present invention.

Example 1A

Preparation of Partially Doped PPV

To effect replacement of chloride by phenylphosphonate: 10 mL of 3 w/v % poly(p-xylylene-alpha-tetrahydrothiophenium chloride) (pre-PPV-C1) (1.3 mmol repeat unit) dissolved in methanol is mixed with 10 mL of 20 w/v % phenylphosphonic acid (13 mmol) dissolved also in methanol. The mixture is then dialysed against pure methanol through a dialysis membrane having molecular weight cut-off of 12,000. This gives a poly(p-xylylene-alpha-tetrahydrothiophenium phenylphosphonate) precursor (pre-PPV-PA) polymer which is retained by the dialysis membrane. The retentate can then be concentrated to the desired concentration and blended with the parent poly(p-xylylene-alpha-tetrahydrothiophenium chloride) in the desired ratio for solution casting. This allows control over the level of doping in the final product.

To Analyse the Material:

(1) A small volume of the methanol solution pre-PPV-,PA was evaporated to give a white solid. Thermogravimetry experiments under nitrogen show this material exhibits a weight loss step extending from 150° C to about 300° C. This occurs over a wider range than for the parent poly(p-xylylene-alpha-tetrahydrothiophenium chloride) material which exhibits a weight loss step ending at about 200° C. This is despite the fact that phenylphosphonate, being a better leaving group than chloride, undergoes slow elimination from the PPV backbone event at room temperature. The greater thermal stability in thermogravimetry experiments is therefore due to the considerably lower vapour pressure (and hence smaller evaporation loss) of phenylphosphonic acid. This confirms that greater retention of the phenylphosphonic acid occurs for the same temperature.

2) The pre-PPV-PA material in methanol is spin-cast onto glass substrates and then baked at 180° C. under vacuum for 2 hours to effect conversion to the conjugated PPV. X-ray photoelectron spectroscopy confirms a significant retention of the PA: 7 mol % (relative to PPV repeat unit) retention of the. PA compared to less than 0.5 mol % retention of Cl in the parent material.

(3) Photothermal deflection spectroscopy of a film of a precursor PPV counterbalanced by 10 mol % PA+90 mol % Cl (made by blending) shows sub-gap absorption strength of 60 $cm^{-1}$ at 750-nm wavelength. This corresponds to a doping level (that is, the ratio of ionized dopant-to-PPV repeat unit) of 0.1 mol %–0.01 mol %

Example 1 B

Diode Structure Including Partially Doped PPV

To demonstrate the improvement in electrical conductivity associated with partial doping according to the present invention diode structures with indium-tin oxide/poly(3,4-dioxy-thiophene) :poly(4-styrenesulfonate) composite anodes and calcium cathodes were fabricated for active layers (i) and (ii) defined in Table 1.

TABLE 1

| Device structure | Drive voltage required to achieve current density of 1 $μA/cm^2$ | Drive voltage required to achieve current density of 10 $μA/cm^2$ |
|---|---|---|
| (i) Undoped 69-nm-thick PPV film with 50 vol % silica | 5.0 V | 7 V |
| (ii) Partially-doped PPV stack having a combined thickness of 207 nm for the films with 50 vol % silica and 171 nm for the neat films, and with an addition 105-nm-thick emitter polymer film | 5.0 V | 10 V |

For the structure (i) with the undoped PPV polymer (dispersed with silica particles to change its refractive index), a large voltage is required to drive currents through a thin film of the material owing to the additional resistance offered by the silica particles. For the structure (ii) with the partially-doped PPV however, the resistance is clearly reduced by a considerable amount. Similar drive voltages can deliver comparable current densities through much thicker combined polymer film thickness. In the absence of doping, the required voltage is expected to increase as the square of the film thickness so that more,than 50 V will be needed for 1 $\mu A/cm^2$ in structure (ii).

At the same time, no deleterious absorptions in the sub-gap spectral region of the PPV occurs. This allows the material to be used in transmissive photonic structures.

Example 2

Partial Doping of Organic-soluble poly(p-phenylenevinylene) and poly(fluorene) Derivatives by Blending with a Second Polymer bearing a Small Fraction of Dopant Acid Groups This is an exemplification of the scheme in FIG. 2a.

Example 2A

Preparation of Partially Doped PPV and Polyfluorene

Poly(styrenesulfonic acid-co-styrene) copolymer (PSSH-co-PS) as the "second polymer" is blended in [alkoxylphenyl-PPV]-co-[dialkoxyl-PPV] (P1) or poly (dialkylfluorene-co-triarylamine) (P2) as host.

This illustrates the generality of the second aspect of the present invention.

To prepare the PSSH-co-PS: 0.5 g of polystyrene (4.8 mmol repeat unit) is dissolved with heating into 5 mL anhydrous chloroform in a borosilicate glass reaction flask sealed with teflon-faced silicone rubber septa, and the mixture cooled to. −8° C. in a bath of calcium chloride and ice-water. 0.01 mL of :chlorosulfonic acid (0.15 mmol) is dissolved into 2 mL of chloroform and then syringed into the PS polymer solution. A white cloudy mixture develops almost immediately. The mixture is warmed to room temperature after 30 minutes and 3 mL of water is added, and the mixture optionally refluxed. To work up, 40 mL of toluene is added and the white precipitate is washed and isolated twice by centrifuge. The precipitate is then purified by dissolving in tetrahydrofuran and re-precipitation from toluene. This material is insoluble in chloroform, methanol or toluene, but soluble in tetrahydrofuran from which good quality films can be cast.

The difference. Fourier-transform infrared spectrum of a thin film of the PSSH-co-.PS cast on silicon substrates shows the asymmetric and symmetric S—O sulfonate bands at 1000–1200 $cm^1$ and the appearance of the 2-adjacent hydrogen wagging vibration at 840–860 $cm^{-1}$. This confirms successful sulfonation of PSSH-co-PS with an expected 1–2 mol % of PSSH. Increasing the PSSH content to 50 mol % leads to an intractable material that is insoluble in common solvents. Increasing the PSSH content further to near 100 mol % gives a material that is soluble in water and methanol. The PSSH-co-PS with a low PSSH content less than 10 mol % is therefore compatible with a range of conjugated polymers, and so can be used to regulate the level of doping in these materials.

Example 2B

A Diode Structure Including a Partially Doped PPV or Polyfluorene

To demonstrate that the PSSH-co-PS material with 2 mol % PSSH can be used to-improve the electrical conductivity of the conjugated polymer host, we fabricated diode structures with indium-tin oxide anodes and aluminium cathodes for the following active layers. The drive voltages for the selected diode current densities are show in Table 2.

TABLE 2

| Device structure | Drive voltage required to achieve current density of 1 $\mu A/cm^2$ | Drive voltage required to achieve current density of 100 $\mu A/cm^2$ |
|---|---|---|
| (i) Undoped 1.05-μm-thick P1 film | 5.5 V | 47 V |
| (ii) Partially-doped 1.05-μm-thick P1 film with 1 w/w % of PSSH-co-PS | 2.0 V | 33 V |
| (iii) Partially-doped 1.05-μm-thick P1 film with 10 w/w % of PSSH-co-PS | 1.1 V | 9 V |
| (iv) Undoped 1.65-μm-thick P2 film | 9.5 V | 40 V |
| (v) Partially-doped 1.65-μm-thick P2 film with 1 w/w % of PSSH-co-PS | 5.5 V | 25 V |

For devices with the 1.05-μm-thick P1 polymer film (that is, structures (i)–(iii)), a substantial reduction in drive voltage, for example from 47 V to 9 V at 100 $\mu A/cm^2$, is achieved upon doping with 10 w/w % of the PSSH-co-PS. At the same time, there is no significant loss of transmission (less than 1% transmission loss) in the sub-gap spectral region of the host polymer. This is because the ratio of PSSH dopant-to-polymer repeat unit is about 0.5 mol %, and the actual doping level (that is, the ratio of ionized PSSH-to-repeat unit) could be even lower depending on the ionization potential of the polymer.

For devices with the 1.65-μm-thick P2 polymer (that is, structures (iv) and (v)), a similar reduction is observed, from 40 V to 25 V at 100 $\mu A/cm2$, upon doping with 1 w/w % of the PSSH-co-PS. In this case, doping with 10 w/w % of the PSSH-co-PS gives phase separation as evident by cloudy nature of the deposited films.

These examples demonstrate the use of partially-derivatised polymeric dopants in a blend to regulate the doping-level and hence improve the electrical conductivity of conjugated polymer films for photonic structures.

Example 3

Partial Doping of an Organic-soluble Poly (fluorene) Derivative by Partial Derivatisation with a Small Fraction of Acid Groups This is an exemplification of the scheme outlined in FIG. 2b.

Example 3A

Preparation of a Partially Doped Poly (fluorene)

In this example, the synthesis and use of a partially sulfonated poly (fluorene-co-triphenylamine) (SP2: S denotes sulfonatation) is used to illustrate the generality of the third aspect of the present invention.

To prepare the SP2-co-P2: 0.1 g of P2 (0.25 mmol fluorene repeat unit) is dissolved into 5 ml of anhydrous chloroform in a borosilicate glass reaction flask sealed with teflon-faced silicone rubber septa, and the mixture cooled to −8° C. in a bath of calcium chloride and ice-water. Chlorosulfonic acid is dissolved into chloroform to give an equivalent of 0.0025 ml of chlorosulfonic acid (0.037 mmol) per ml of chloroform 1 mL of this solution is then syringed into the P2 polymer solution. An orange solution is obtained almost immediately. The mixture is warmed to room temperature after 30 minutes, and 40 mL of acetone is then added to produce a white precipitate. The precipitate is recovered by centrifugation and then purified by dissolving in chloroform and re-precipitating from methanol. This SP2-co-P2 material is soluble in chloroform, toluene and tetrahydrofuran but insoluble in methanol and acetone.

The difference Fourier-transform infrared spectrum of a thin film of the SP2-co-P2 material cast on silicon substrates shows (i) the asymmetric and symmetric S—O sulfonic bands at 1355 cm$^{-1}$ and 1175 cm$^{-1}$ respectively, (ii) the S–O band at 905 cm$^{-1}$, (iii) the appearance of the one-hydrogen wagging vibration at 860–880 cm$^{-1}$. This confirms sulfonation of SP2-co-P2 with an expected 5–10 mol % of sulfonic acid groups.

To demonstrate that this derivatised material, has a better electrical conductivity than its parent, we fabricated diode structures with indium-tin oxide anodes and aluminium cathodes for the following active layers. The drive voltages for selected diode current densities are shown in Table 3.

TABLE 3

| Device structure | Drive voltage for current density of 1 µA/cm$^2$ | Drive voltage for current density of 100 µA/cm$^2$ |
|---|---|---|
| (i) Undoped 1.1-µm-thick P2 film | 10.5 V | 31 V |
| (ii) Partially-doped 1.1-µm-thick P2 film with 1 w/w % of SP2-co-P2 | 4.5 V | 21 V |

A significant reduction in drive voltage, for example from 31 V to 21 V at 100 µA/cm$^2$ in 1.1-µm-thick films, is obtained in the presence of partial doping by an equivalent of 0.05 mol %–0.1 mol % of sulfonic acid groups. At the same time, there is no significant loss of transmission in the sub-gap spectral region of this P2 polymer.

This example therefore demonstrates the use of a controlled level of dopant derivatisation of the conjugated polymer to improve the electrical conductivity of conjugated polymer films for use in photonic structures.

Example 4

Examples 2 and 3 were repeated but with the sulfonic acid polymer subsequently reacted with quantitative amounts of o-nitrobenzylbromide in chloroform or tetrahydrofuran before film formation to give the o-nitrobenzylsulfonate ester as the precursor dopant. The polymer was then blended with the host polymer as in Example 2 or used neat (similar to Example 3) in a suitable solvent and formed into a film. The precursor sulfonate ester group was then cleaved by UV exposure to generate the active sulfonic acid group in the film.

Example 5

Examples 2 and 3 were repeated but with the sulfonic acid polymer subsequently reacted with excess of methylating agent such as diemthylsulfate before film formation to give the methylsulfonate ester as the precursor dopant. The polymer was then blended with small quantities of a photoacid generator such as diphenyliodonium chloride or other diaryliodonium, triarylsulfonium or other onium salts, and further optionally blended with the host polymer (such as in Example 2) or used substantially neat (similar to Example 3) in a suitable solvent and formed into a film. The polymer film was then exposed to light or heat to cleave the photoacid generator to produce a strong acid with then cleaves the sulfonate ester to the active sulfonic acid. The present invention is not limited to the examples described above.

The present invention may include any feature or combination of features disclosed herein either implicitly or explicitly or any generalization thereof, without limitation to the scope of any of the present claims. In view of the foregoing description it will be evident to a person skilled in the art that various modifications may be made within the scope of the invention.

What is claimed is:

1. A method for forming a conjugated polymer which is doped by a dopant comprising the steps of:
   (a) adding a doping agent comprising a dopant moiety to a solution comprising the conjugated polymer or a precursor thereof and, optionally, a second polymer, the dopant moiety being capable of bonding to the conjugated polymer, precursor thereof or the second polymer; and,
   (b) allowing the dopant moiety to bond to the conjugated polymer, precursor thereof or the second polymer to perform doping of the conjugated polymer;
   wherein the amount of doping agent added in step (a) is less than the amount required to form a fully doped conjugated polymer.

2. A method according to claim 1, wherein the amount of doping agent added in step (a) is in the range of less than 10–20% of the amount required to form a fully doped conjugated polymer.

3. A method according to claim 1, wherein the amount of doping agent added in step (a) is sufficient to form a 0.1% to 5% doped conjugated polymer.

4. A method according to claim 3, wherein the amount of doping agent added in step (a) is sufficient to form a 1% doped conjugated polymer.

5. A method according to claim 1, wherein the doping agent is a protonic acid doping agent.

6. A method according to claim 5, wherein the dopant moiety is selected from the group consisting of phosphonic acid groups, sulfonic acid groups, fluoroalkyl carboxylic acid groups and indene carboxylic acid groups.

7. A method according to claim 1, wherein the dopant moiety comprises a precursor to the dopant.

8. A method according to claim 7, wherein the precursor dopant moiety comprises phosphonate or sulfonate.

9. A method according to claim 8, including a step of heating the dopant moiety to generate the dopant.

10. A method according to claim 1, wherein step (b) includes cleaving the dopant moiety from the conjugated polymer, precursor thereof or the second polymer.

11. A method according to claim 10, comprising cleaving the dopant moiety by heating.

12. A method according to claim 1, wherein the dopant moiety bonds to the conjugated polymer, precursor thereof or the second polymer in step (b) via a spacer group.

13. A method according to claim 1, further including a step of forming a conjugated polymer from the precursor thereof.

14. A method according to claim 13, wherein the precursor of the conjugated polymer comprises a substituted precursor polyelectrolyte PPV.

15. A method according to claim 1, wherein the conjugated polymer comprises substituted or unsubstituted PPV.

16. A method according to claim 14, wherein the conjugated polymer comprises the structure shown in formula I or II:

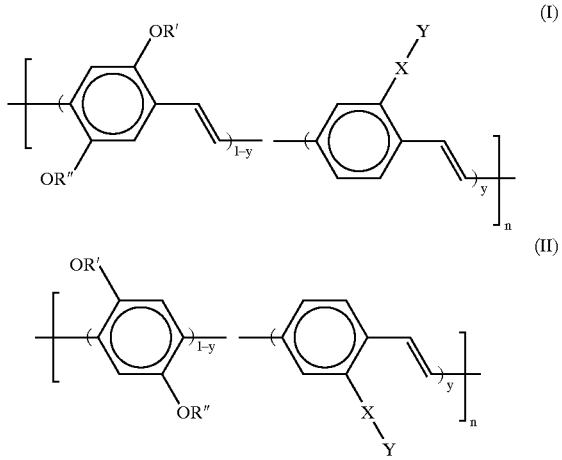

where Y is the dopant moiety; OR' and OR" are each an alkoxy group or H; X is an alkyl or aryl spacer group or a direct bond; $y \leq 0.05$ and $n \geq 10$.

17. A method according to claim 1, comprising copolymerizing the second polymer with the conjugated polymer or precursor thereof prior to adding the doping agent in step (a).

18. A method according to claim 1, comprising blending the second polymer with the conjugated polymer or precursor thereof prior to adding the doping agent in step (a).

19. A method according to claim 18, wherein the second polymer comprises substituted or unsubstituted PPV.

20. A method for forming a partially doped polymer comprising the steps of:
   (a) adding a doping agent to the polymer or a precursor thereof, the doping agent being capable of bonding to the precursor or the polymer; and
   (b) causing the doping agent to leave the precursor or the polymer to form a dopant capable of doping the polymer;
   wherein fewer moles of the doping agent are added than would be numerically sufficient to fully dope the polymer chain.

21. A method according to claim 20, additionally comprising the step of:
   (c) causing the dopant to dissociate to form a substantially uniformly doped conjugated polymer.

22. A method according to claim 20, additionally comprising the step of processing the solution to form a film layer.

23. A doped conjugated polymer preparable by the method as defined in claim 1.

24. A polymer according to claim 23, wherein the doped conjugated polymer has a conductivity of more than $10^{-9}$ S/cm and less than 1 S/cm.

25. A polymer according to claim 24, wherein the doped conjugated polymer has a conductivity of from $10^{-8}$ S/cm to $10^{-3}$ S/cm.

26. A polymer as defined in claim 23, comprising a light emissive material.

27. A photonic device comprising a polymer as defined in claim 23.

28. An optical device comprising a polymer as defined in claim 23.

29. A method according to claim 15, wherein the conjugated polymer comprises the structure shown in formula I or II:

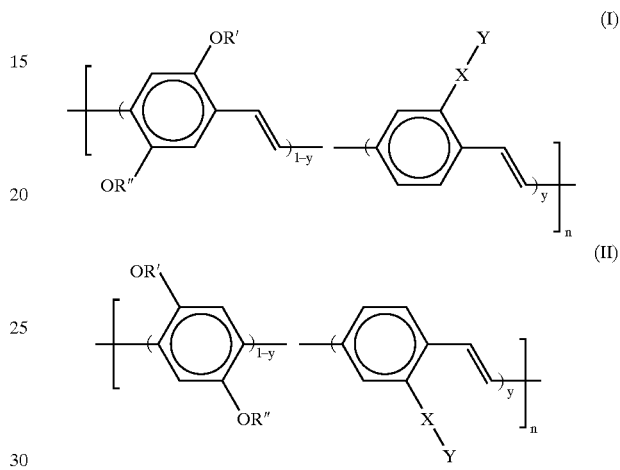

where Y is the dopant moiety; OR' and OR" are each an alkoxy group or H; X is an alkyl aryl spacer group or a direct bond; $y \leq 0.05$ and $n \geq 10$.

30. A method according to claim 1, additionally comprising the step of:
   (c) causing the dopant to dissociate to form a substantially uniformly doped conjugated polymer.

31. A method according to claim 1, additionally comprising the step of processing the solution to form a film layer.

32. A doped conjugated polymer preparable by the method as defined in claim 31.

33. A polymer according to claim 32, wherein the doped conjugated polymer has a conductivity of more than $10^{-9}$ S/cm and less than 1 S/cm.

34. A polymer according to claim 33, wherein the doped conjugated polymer has a conductivity of from $10^{-8}$ S/cm to $10^{-3}$ S/cm.

35. A polymer as defined in claim 32, comprising a light emissive material.

36. A photonic device comprising a polymer as defined in claim 32.

37. An optical device comprising a polymer as defined in claim 32.

* * * * *